(12) United States Patent
Mizuno et al.

(10) Patent No.: US 7,632,550 B2
(45) Date of Patent: *Dec. 15, 2009

(54) FILM FORMING METHOD EMPLOYING REACTIVE AND REDUCING GASES AND SUBSTRATE FORMED BY THE METHOD

(75) Inventors: Wataru Mizuno, Hino (JP); Kazuhiro Fukuda, Hino (JP); Yoshikazu Kondo, Hino (JP); Yoshiro Toda, Hino (JP); Kiyoshi Oishi, Hino (JP); Akira Nishiwaki, Hino (JP)

(73) Assignee: Konica Corporation, Tokyo (JP)

( * ) Notice: Subject to any disclaimer, the term of this patent is extended or adjusted under 35 U.S.C. 154(b) by 341 days.

This patent is subject to a terminal disclaimer.

(21) Appl. No.: 10/364,551

(22) Filed: Feb. 11, 2003

(65) Prior Publication Data
US 2003/0157378 A1 Aug. 21, 2003

(30) Foreign Application Priority Data

Feb. 15, 2002 (JP) ............................... 2002-038933
Jun. 11, 2002 (JP) ............................... 2002-170015

(51) Int. Cl.
*C23C 16/06* (2006.01)
*H05H 1/24* (2006.01)
(52) U.S. Cl. ................... 427/576; 427/569; 427/250; 427/255.28
(58) Field of Classification Search ............. 427/569, 427/576
See application file for complete search history.

(56) References Cited

U.S. PATENT DOCUMENTS

| 4,415,602 | A | * | 11/1983 | Brodie et al. | 427/576 |
|---|---|---|---|---|---|
| 4,438,154 | A | * | 3/1984 | Kato et al. | 427/579 |
| 4,626,448 | A | * | 12/1986 | Hays | 427/576 |
| 5,194,291 | A | * | 3/1993 | D'Aoust et al. | 148/278 |
| 5,304,407 | A | * | 4/1994 | Hayashi et al. | 427/569 |
| 5,384,167 | A | | 1/1995 | Nishiwaki et al. | |
| 5,731,634 | A | * | 3/1998 | Matsuo et al. | 257/752 |
| 6,028,014 | A | * | 2/2000 | Sukjarev | 438/789 |

(Continued)

FOREIGN PATENT DOCUMENTS

GB 2030180 A * 4/1980

(Continued)

OTHER PUBLICATIONS

Mizuno et al, Characterization of Ultra-Short Pulsed Discharge Plasma for CVD Processing, IEE Transaction on Industry Applications, vol. 29, No. 3. 1993. pp. 656-660.*

(Continued)

Primary Examiner—David Turocy
(74) Attorney, Agent, or Firm—Lucas & Mercanti, LLP (57) ABSTRACT

A film forming method comprising: supplying a reactive gas comprising a compound including a metal atom between facing electrodes; arranging a substrate between the electrodes; making the reactive gas in a plasma state by applying a voltage between the electrodes under atmospheric pressure or under a pressure in a vicinity of the atmospheric pressure and discharging; and forming a metal film on a surface of the substrate by supplying a reducing gas having a reducing property into a plasma atmosphere in which the reactive gas in the plasma state exists.

10 Claims, 1 Drawing Sheet

U.S. PATENT DOCUMENTS

| | | | |
|---|---|---|---|
| 6,306,756 B1 | 10/2001 | Hasunuma et al. | |
| 6,342,277 B1 * | 1/2002 | Sherman | 427/562 |
| 6,441,554 B1 * | 8/2002 | Nam et al. | 315/111.21 |
| 6,835,425 B2 * | 12/2004 | Fukuda et al. | 427/569 |
| 2002/0013487 A1 * | 1/2002 | Norman et al. | 556/7 |
| 2002/0094387 A1 * | 7/2002 | Bhan | 427/569 |

FOREIGN PATENT DOCUMENTS

| | | | |
|---|---|---|---|
| JP | 4337076 | | 11/1992 |
| JP | 794425 | | 4/1995 |
| JP | 9181016 | | 7/1997 |
| JP | 10154598 | * | 6/1998 |
| JP | 63203772 | | 8/1998 |
| JP | 1129873 | | 2/1999 |
| JP | 11236667 | | 8/1999 |
| JP | 11236676 | * | 8/1999 |
| JP | 2000204475 | * | 7/2000 |
| JP | 2000204476 | * | 7/2000 |
| JP | 2000282243 | | 10/2000 |
| JP | 2000303175 | | 10/2000 |
| JP | 2001102198 | | 4/2001 |
| JP | 2001271167 | | 10/2001 |
| JP | 2002-110397 | * | 4/2002 |
| WO | WO02/48428 | * | 6/2002 |

OTHER PUBLICATIONS

Partial European Search Report EP 03 25 0802 One page English Abstract, Patent Abstracts of Japan.
Publication No. 11236676, Publication date: Aug. 31, 1999 One Page English Abstract, Patent Abstracts of Japan.
Publication No. 2000282243, Publication date: Oct. 10, 2000 One page English Abstracts, Patent Abstracts of Japan.
Publication No. 2000204476, Publication date: Jul. 25, 2000 One page English Abstract, Patent Abstracts of Japan.
Publication No. 2000204475, Publication date: Jul. 25, 2000.

* cited by examiner

FIG.1

FILM FORMING METHOD EMPLOYING REACTIVE AND REDUCING GASES AND SUBSTRATE FORMED BY THE METHOD

BACKGROUND OF THE INVENTION

1. Field of the Invention

The present invention relates to a film forming method for forming a metal film on a surface of a substrate by making a reactive gas into plasma under atmospheric pressure or under a pressure in the vicinity of atmospheric pressure, and to a substrate having a metal film formed by the above-described film forming method.

2. Description of Related Art

In earlier technology, as methods for forming a metal film, which is used as an electrode or the like, on a substrate, there are wet plating methods, such as electroplating, nonelectrolytic plating and the like, dry (vapor) plating methods, such as vacuum deposition, sputtering, ion plating, MOCVD (Metal organic chemical vapor deposition) and the like, plasma spraying, and the like.

However, with respect to the wet plating methods, the kinds of metals which are capable of being plated are limited. Further, troublesome wastewater treatment is required with plating operation. Further, with respect to the dry plating methods, since huge facilities to make a vacuum state are generally required, cost is high, and moreover, there is a problem that the film forming rate is slow. With respect to the plasma spraying method, there is a problem that a precise film is hard to be formed since it is a method for utilizing arc discharge.

Further, recently, an atmospheric pressure plasma method for forming a film by plasma CVD under a pressure in the vicinity of atmospheric pressure has been known. According to this method, the film forming rate is larger than the vacuum state. However, in order to form a pure metal film by the previous atmospheric pressure plasma method, there is a problem that it is inferior in respect of purity and its electric conductivity is low compared with, for example, a vacuum sputtering method or the like.

SUMMARY OF THE INVENTION

The present invention was made in view of the above-described problem. An object of the present invention is to provide a film forming method capable of obtaining good films of various kinds of metals that requires only simple facilities or operation process compared with the earlier technology, and thereby the cost is low, and that a film forming rate is large, and to provide a substrate having a metal film formed by the above-described method.

In order to solve the above-described problems, according to a first aspect of the present invention, the film forming method of the present invention comprises: supplying a reactive gas comprising a compound including a metal atom between facing electrodes; arranging a substrate between the electrodes; making the reactive gas in a plasma state by applying a voltage between the electrodes under an atmospheric pressure or under a pressure in a vicinity of the atmospheric pressure and discharging; and forming a metal film on a surface of the substrate by supplying a reducing gas having a reducing property into a plasma atmosphere in which the reactive gas in the plasma state exists.

Further, according to a second aspect of the present invention, the film forming method of the present invention comprises: supplying a reactive gas comprising a compound including a metal atom between facing electrodes; arranging a substrate between the electrodes; making the reactive gas in a plasma state by applying a voltage between the electrodes under an atmospheric pressure or under a pressure in a vicinity of the atmospheric pressure and discharging; and forming a metal film on a surface of the substrate by discharging by supplying an electricity not less than 1 W/cm$^2$ under a high-frequency voltage over 100 kHz between the facing electrodes. Preferably, a reducing gas having a reducing property is supplied in a plasma atmosphere in which the reactive gas in the plasma state exists.

In this film forming method, it is preferable to supply the high-frequency voltage not less than 200 kHz between the facing electrodes.

In the above-described film forming methods, the reducing gas may be supplied after a metal oxide film derived from the reactive gas is formed on the surface of the substrate, and the metal film may be formed by reducing the metal oxide film. Further, the forming of the metal oxide film and the reducing of the metal oxide film by the reducing gas may be repeated several times. In addition, the reactive gas and the reducing gas may be supplied approximately at once.

Moreover, an electric conductivity of the metal film is preferable to be controlled by including a predetermined concentration of an impurity. Preferably, the impurity is one or more kinds among each element of H, C, N, O, F, S, Cl, Br and I. Further, an amount of the impurity is preferable to be adjusted by a power of the voltage applied between the electrodes or a concentration of the reducing gas.

Furthermore, preferably, the plasma state is controlled by applying a pulse voltage between the facing electrodes and by adjusting its duty ratio, and an amount of the impurity is monitored on the basis of an emission spectrum in the plasma atmosphere.

One or more among hydrogen, ammonia, methane, ethane, hydrogen iodide, hydrogen sulfide, carbon monoxide, sulfur dioxide, hydrogen peroxide, and water may be used as the reducing gas. The reducing gas is preferable to be supplied as a reductive mixed gas with an inert gas, and the reductive mixed gas is preferable to include 1 volume % to 10 volume % of the reducing gas.

Further, the compound including the metal atom is preferable to be an organometallic compound. Preferably, the organometallic compound is selected from a group of titanium compound, copper compound, indium compound, zinc compound, tin compound, aluminum compound, and silver compound.

Moreover, according to a third aspect of the present invention, the substrate of the present invention comprises provided with a metal film formed by the film forming method in the first aspect or the second aspect of the present invention on a surface thereof.

BRIEF DESCRIPTION OF THE DRAWINGS

The present invention will become more fully understood from the detailed description given hereinbelow and the appended drawings which given by way of illustration only, and thus are not intended as a definition of the limits of the present invention, and wherein.

DETAILED DESCRIPTION OF THE INVENTION

Hereinafter, the present invention will be explained in detail.

In a film forming method of the present invention, a voltage is applied between facing electrodes so as to discharge under atmospheric pressure or under a pressure in the vicinity of atmospheric pressure to make a reactive gas in a plasma state. Then, a film is formed on a surface of a substrate by the reactive gas in the plasma state. The reactive gas comprises a compound including a metal atom, and the film forming method is for forming a metal film on the surface of the substrate by supplying a reducing gas having reducing property into a plasma atmosphere. Here, atmospheric pressure or the pressure in the vicinity of the atmospheric pressure is a pressure between 20 kPa and 110 kPa, and preferably, between 93 kPa and 104 kPa.

Concretely, in the film forming method of the present invention, a reactive mixed gas including a reactive gas used as a material of the metal film and an inert gas (includes not only noble gases, but also $N_2$ gas and the like) used as a plasma source is introduced, and a reductive mixed gas including a reducing gas having a reducing property and an inert gas is introduced. Thereby, the metal film is formed finally.

As the steps, the reactive mixed gas and the reductive mixed gas may be supplied approximately at once. In this case, the metal film is formed directly on the substrate. Microscopically, it can be considered that it includes a step such that a metal oxide film is formed temporarily and thereafter reduced.

Incidentally, in the atmospheric pressure plasma method, plasma is generated by introducing an inert gas, such as argon or the like. However, when a gas having reducing property is introduced, the ratio of the inert gas is reduced by that much, and it becomes hard to generate plasma, so that forming of the film becomes a little slow. Then, in case that it is required to increase the film forming rate as much as possible, it is possible to form a metal film on the surface of the substrate by supplying a reductive mixed gas to reduce a metal oxide film after forming the metal oxide film derived from a reactive gas, not by the method for supplying the reactive mixed gas and the reductive mixed gas at once as described above.

Moreover, deposition and reducing of the metal oxide film may be repeated plural times, such as forming (deposition) of a metal oxide film→reducing (forming of a metal film) →deposition of a metal oxide film→reducing . . . . When reducing is performed after a metal oxide film is deposited thickly in one step, there is a possibility that only a surface of the metal oxide film is reduced. However, a metal film can be obtained by reducing sufficiently the whole film by repeating a plural steps, and moreover, a precise film can be obtained by depositing repeatedly the films. Concretely, reducing is preferable to be performed after depositing 0.1 nm to 500 nm of a metal oxide film. Furthermore, reducing is preferable to be performed after depositing 0.1 nm to 50 nm of a metal oxide film.

As a reducing gas used in the present invention, it may be a reducing agent which can be supplied into a plasma device in a gaseous or mist-like state. For example, hydrogen ($H_2$), ammonia ($NH_3$), methane ($CH_4$), ethane ($C_2H_6$), hydrogen iodide (HI), hydrogen sulfide ($H_2S$), carbon monoxide (CO), sulfur dioxide ($SO_2$), hydrogen peroxide ($H_2O_2$), water ($H_2O$) are given, and one or more out of these can be used. Particularly, $H_2$, $NH_3$ and $CH_4$ are preferable.

The above-described reducing gas is supplied into the device as a reductive mixed gas with an inert gas, and is preferable to be included 1 to 10 volume % in the reductive mixed gas.

Further, as an inert gas included in the reductive mixed gas, concretely, helium, neon, argon, krypton, xenon, radon and the like can be given. In view of easy generation of plasma, helium and argon, particularly, argon is used preferably.

A pure metal film can be formed by supplying these reducing gases to remove oxygen in the atmosphere or to reduce the metal oxide film. Moreover, not only oxygen, but also elements of halogen system, such as fluorine, chlorine and the like, impurities, such as sulfur, carbon, nitrogen and the like, can be removed by the reducing gases. For example, when hydrogen is used as a reducing gas, hydrogen can be removed as $H_2O$, carbon mainly as methane, and nitrogen as ammonia. In regard to this point, a metal film having few impurities can be formed.

As a reactive gas used in the present invention, it is indispensable to include metal. An organometallic compound is used suitably, and particularly, a compound capable of being supplied in a gaseous or mist-like state into a plasma space is preferable. "Capable of being supplied in a gaseous or mist-like state" may be capable of being supplied directly at ordinary temperature and ordinary pressure, or when it is liquid or solid at ordinary temperature and ordinary pressure, it may be evaporated by a method, such as heating, reducing pressure, irradiating ultrasonic wave, or the like, or it may be dissolved in a suitable solvent. The solvent will be resolved at molecular lever or atomic level in plasma at the time of dilution, so that its effect on forming of the metal film can be almost negligible.

As an example of an organometallic compound, organosilicon compound, organotitanium compound, organotin compound, organozinc compound, organoindium compound, organoaluminum compound, organocopper compound, organosilver compound or the like is given.

Further, as an organometallic compound, metal alkoxide, organometallic complex or the like is preferable despite of the kinds of metals. For example, a compound which can be expressed by the general formula (1) is preferable. Here, the symbol M denotes metal atom, the symbols $X_1$ and $X_2$ denotes functional groups including carbon, and the symbol n denotes the number of bonds to metal, which is an integer number more than one.

(1)

As examples of the above-described metal alkoxide or organometallic complex, titanium ethoxide (TEOT) and titanium isopropoxide (TTIP) are given as the titanium compound, hfa•Cu•tmvs (the following formula (2)) as the copper compound, tris (2,2,6,6-tetramethyl-3,5-heptanedionate), indium III (the following formula (3)) as the indium compound, $DPM_2Zn$ (Bisdipivaloylmethanatozinc) as the zinc compound, and dibutyltin diacetonate $(n-C_4H_9)_2Sn(OCOCH_3)_2$ as the tin compound.

In addition, as a metal atom M, the organometallic compound of the above-described general formula (1) including a metal atom, such as Ag, Al, Mg, Li, Ca or the like is given.

The above-described reactive gas is preferable to be included 0.01 to 10 volume % in the reactive mixed gas.

Further, as an inert gas included in the reactive mixed gas, an eighteenth group element in the periodic table, concretely, helium, neon, argon, krypton, xenon, radon or the like, is given. In order to obtain the effect of the present invention, helium and argon are used preferably. In order to form a precise and high accuracy thin film, it is most preferable to use argon as an inert gas. It is presumed that high-density plasma is generated easily when argon is used. The ratio of the inert gas is not less than 90 volume %, preferably, not less than 95 volume % in the reactive mixed gas.

Further, when reducing is performed after deposition of the above-mentioned metal oxide film (including repeating), 0.01 to 1 volume % of an additive component selected from hydrogen ($H_2$), oxygen ($O_2$), ozone ($O_3$), $C_HXF_{4-X}$ ($0 \leq X \leq 4$), $CH_XCl_{4-X}$ ($0 \leq X \leq 4$), ammonia ($NH_3$), hydrogen iodide (HI), hydrogen sulfide ($H_2S$), carbon monoxide (CO), sulfur dioxide ($SO_2$), hydrogen peroxide ($H_2O_2$), water ($H_2O$) and the like is included in the reactive mixed gas. Thereby, the reaction is promoted, and a precise and good thin film can be formed.

Here, although these additive components include common components with the above-described reducing gas, these are supplied with the reactive gas and added when depositing a metal oxide film. A precise, pure, and better metal oxide film can be formed by adding these gases. Thereby, the metal film obtained after reducing this metal oxide film becomes good.

Further, the method of the present invention is for obtaining certainly a pure metal film. However, a film including a predetermined concentration of impurities in accordance with desired physicality can be formed on purpose. For example, the electric conductivity of a film can be made lower than a pure metal film by including a predetermined ratio of one or more kinds of elements out of H, C, N, O, F, S, Cl, Br and I. These elements are derived from all of the above-mentioned gas components, that is, they are derived from the reactive gas, reducing gas, minor components in the inert gas supplied with the reactive and reducing gases, and moreover from the additive components added with the reactive gas.

The contents of the impurities can be controlled by controlling the plasma state. Concretely, power of the voltage applied at the time of plasma reduction, or the concentration of the reducing gas can be adjusted. Furthermore, as described later, when applying pulse voltage to a high-frequency power source, it can be controlled by changing the duty ratio of pulse. The amount of impurities can be checked by, for example, ESCA (Electgron Spectroscopy for Chemical Analysis) after a film is formed. If it is a C element or O element, it is adjusted to include it in a range of 0 to 10%.

Figure 1:
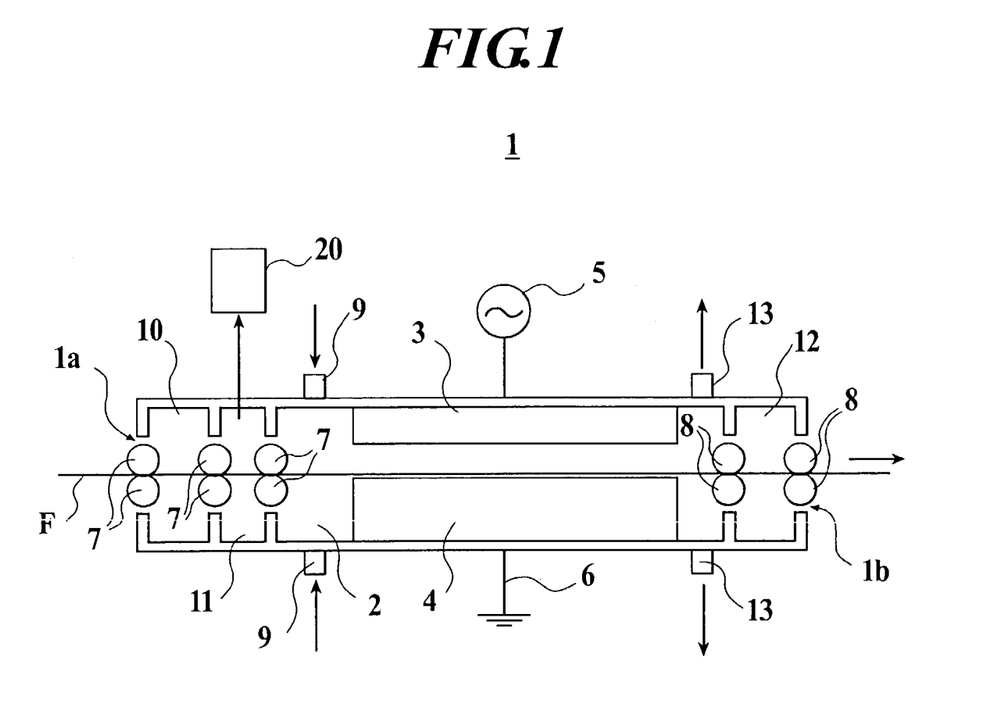
FIG. 1 is a schematic view showing an example of a plasma treatment device used in a film forming method of the present invention.

In the present invention, a metal film is formed by using, for example, a plasma treatment device 1 shown in FIG. 1. In FIG. 1, the symbol F is a long film made from polymer and the like, which is an example of a substrate in the present invention. Preferably, a charge removing treatment or waste removing treatment for preventing electrostatic charge is performed to the film F before a plasma treatment is performed.

In the plasma treatment device 1 shown in FIG. 1, flat electrodes 3 and 4 facing by keeping a predetermined space between each other are provided. A high-frequency power source 5 is connected to the electrode 3, and on the other hand, the electrode 4 is connected to a ground potential.

Electricity large to some extent is preferable to be supplied between the electrodes under a high-frequency voltage in order to obtain high plasma density and make the film forming rate large.

Particularly, an extremely good metal film can be formed in high productivity by combination of controlling of such an electric field and the reactive gas including metal. Concretely, it is preferable to apply a high-frequency voltage of not less than 100 kHz to not more than 800 MHz, and it is more preferable if it is not less than 200 kHz. Further, the lower limit of the electricity for being supplied between the electrodes is preferable to be not less than 1 W/cm² to not more than 50 W/cm², and it is more preferable if it is not less than 2 W/cm². Here, the voltage applied area (/cm²) in the electrodes is an area in a range that discharge occurs.

The high-frequency voltage applied between the electrodes may be an intermittent pulse wave or a continuous sine curve. In case of making the film forming rate large, the sine curve is preferable.

Further, in case of including impurities in a metal film as mentioned before, it may be a pulse wave. This is because the plasma density becomes low in off-time and the reactivity of the intermittent pulse wave in the system becomes weaker than a continuous sine curve, so that the reaction for removing the impurity concentration by a reducing gas will be suppressed. Therefore, the impurity concentration in the film can be controlled by controlling the duty ratio of the pulse wave. In case of controlling impurity concentration, the duty ratio is controlled within a range of 0.1 to 10. As a method for generating a pulse wave, for example, when a high-frequency voltage between 100 kHz and 800 MHz is applied to the electrode 3, the pulse wave is generated by superimposing a pulse voltage between 10 and 100 kHz.

As the electrodes 3 and 4, it is preferable to be the ones such that a metal base material is covered with a dielectric. Here, as a metal used as the base material, metals, such as silver, platinum, stainless steel, aluminum, iron and the like, can be used, however, stainless steel is preferable in view of easiness of processing.

At least one of the electrodes 3 and 4 is covered with a dielectric. Preferably, both of them are covered with dielectrics. As a dielectric, an inorganic material having dielectric constant between 6 and 45 is preferable.

As a dielectric, silicate system glass, borate system glass, phosphate system glass, germate system glass, tellurite glass, aluminate glass, vanadate glass or the like can be provided by lining them. Among these, the borate system glass is easy to process. Further, it is preferable to use sintered ceramics such that ceramics having high airtightness and high thermal resistance are sintered. As a material of sintered ceramics, there are, for example, alumina system, zirconia system, silicon nitride system, and silicon carbide system ceramics.

The shortest distance between a dielectric and the facing electrode when the dielectric is provided on one of the electrodes 3 and 4, and the distance between both dielectrics when the dielectrics are provided on both of the above-described electrodes are both preferable to be between 0.5 mm and 20 mm in view of performing uniform discharge, particularly, it is preferable to be 1 mm±0.5 mm. The distance between the electrodes is determined by taking the thickness of the dielectrics around the electrodes, the amount of applied voltage, and the like into consideration.

Further, in case of exposing the substrate F to plasma by placing the substrate F between the electrodes or by conveying it between the electrodes as shown in FIG. 1, the thickness of the dielectrics and the gap between the electrodes can be kept constant and the discharged state can be stabilized by further polishing to finish the surface of the dielectrics to make the surface roughness Rmax (JIS B 0601) of the electrodes not more than 10 µm.

Further, in making electrodes by covering dielectrics to metal base materials, as described above, it is required to polish to finish the dielectrics or make the difference of thermal expansion between the metal base materials and the dielectrics of the electrodes small. Therefore, it is preferable to perform lining an inorganic material as a layer which can absorb a stress by controlling the amount of mixed bubbles, on the surface of the base materials. Particularly, a glass obtained by fusion method which is known in enamel or the like is preferable as a material. Moreover, good electrodes which are precise and no cracks and the like is generated can be obtained by making the amount of mixed bubbles in the lowest layer, which contacts with the conductive metal base materials, between 20 and 30 volume %, and not more than 5 volume % in the following and subsequent layers.

Further, as another method for covering base materials of electrodes with dielectrics, performing thermal spraying of ceramics precisely until the void fraction becomes not more than 10 volume %, and moreover, performing sealing treatment by an inorganic material which is hardened by sol-gel reaction can be given. Here, in order to promote the sol-gel reaction, heat curing or UV curing is preferable. Moreover, mineralization improves more by diluting the sealing solution and by repeating the coating and hardening sequentially for several times, so that precise electrodes having no deterioration can be obtained.

The pressure in a treatment room 2 in the plasma treatment device 1 is not conditioned particularly, and is kept in atmospheric pressure or a pressure in the vicinity of atmospheric pressure, including after introduction of gases.

As shown in FIG. 1, in an entrance 1a side of the plasma treatment device 1, spare rooms 10 and 11 which follow the treatment room 2 are provided. In an exit 1b side of the device 1, a spare room 12 which follows the treatment room 2 is provided. The inner pressure of the spare rooms 10, 11 and 12 is conditioned so that the pressure in the treatment room 2 will become higher than the inner pressure of the spare rooms 10, 11 and 12 at the time of forming a metal film. Thus, by generating pressure difference, the external air is prevented from being mixed, and the reactive gas in gas is promoted to be in a plasma state. As a method for conditioning, for example, a vacuum fan or vacuum pump 20 or the like may be used. Here, the spare rooms may not be provided, and their number or size can be modified suitably.

Nip rollers 7 and 7 are provided in the entrance 1a, between the spare room 10 and the spare room 11, and between the spare room 11 and the treatment room 2, respectively, and nip rollers 8 and 8 are provided between the treatment room 2 and the spare room 12, and in the exit 1b, respectively, for both partition for pressure control as described above or preventing air from being mixed and conveyance of a film F.

The film F conveyed in from the entrance 1a of the plasma treatment device 1 is plasma treated in a state contacted with the electrode 4, and conveyed out from the exit 1b.

The treatment room 2 has air supply openings 9 and 9 for introducing mixed gases into the treatment room 2, and exhaust openings 13 and 13 for exhausting gases.

When forming a thin film on a surface of the film F by using the plasma treatment device 1, at first, the film F is pressed by the nip rollers 7 and 7, and conveyed in the treatment room 2 in a state contacted with the electrode 4. In the treatment room 2, there exist a reactive mixed gas and a reductive mixed gas introduced by the air supply openings 9 and 9. A voltage of a predetermined frequency is applied to the electrode 3 by a high-frequency power source 5 to generate discharge plasma. Then, after a metal film derived from the reactive gas is formed on the surface of the film F, the film F is conveyed out from the exit 1b.

Here, the plasma treatment device 1 shown in FIG. 1 is only an example, and the plasma treatment device used in the present invention may have other construction. For example, it may be a device having a construction such that plasma is generated by passing a substrate between an electrode formed in a roller-shape and an electrode arranged around the roller-shaped electrode. Alternatively, it may be a device having a construction such that a substrate is not disposed between electrodes but ions or the like made to be in a plasma state between the electrodes are sprayed to the substrate disposed in the vicinity of the electrodes.

In the film forming method of the present invention, in order to obtain a pure metal film, or in order to obtain a desired impurity concentration, preferably, the plasma emission spectrums are monitored in real time by an emission spectrophotometer to detect each component in plasma atmosphere, during plasma treatment.

That is, since wavelengths of the emission spectrums are different according to plasma types, the particles existing in plasma atmosphere can be known by detecting the intensity of emission spectrum of each wavelength. For example, in order to obtain a pure metal film by reducing a metal oxide film, when a peak due to oxygen (typical wavelength of 777 nm) disappears in emission spectrum, it can be realized that the reduction is finished and a pure metal film is obtained. Thus, the finished time of reaction can be detected by monitoring. Further, if an analytical curve about the relationship between the luminescent intensity in plasma atmosphere and the concentration of impurities remained in the obtained metal film with respect to a certain type of impurity is made beforehand, a desired concentration of impurity can be included in the obtained metal film by monitoring and stopping plasma treatment when a predetermined luminescence intensity is obtained with respect to the impurity.

The wavelengths to be monitored are in a range of, for example, 200 to 1000 nm, which includes the emission spectrum of each element sufficiently.

As a metal film formed by the film forming method of the present invention, the one or more selected from Li, Be, B, Na, Mg, Al, P, K, Ca, Sc, Ti, V, Cr, Mn, Fe, Co, Ni, Cu, Zn, Ga, Ge, As, Se, Rb, Sr, Y, Zr, Nb, Mo, Pd, Ag, Cd, In, Sn, Sb, Te, Cs, Ba, La, Hf, Ta, W, Ir, Pt, Au, Hg, Tl, Pb, Bi, Ce, Pr, Nd, Pm, Eu, Gd, Tb, Dy, Ho, Er, Tm, Yb, and Lu is given.

Its use is not limited particularly. For example, electrode or wiring, magnetic storage film, superconductive film, reflective film, heat-resistant film, abrasion-resistant film, and corrosion-resistant film are given.

Particularly, when it is used for wiring of a circuit or for electrode, it is preferable to be formed by one or more selected from Al, Ti, Cr, Mn, Fe, Co, Ni, Cu, Zn, Pd, Ag, In, Sn, Ta, W, Pt, and Au.

The film thickness of the formed metal film is in a range of 0.1 nm to 10 μm.

With respect to a substrate on a surface of which a metal film is formed in the present invention, its shape is not limited if it has a shape to form a film on its surface, such as film-like, fiber-like, bulk-like or the like. Further, its material is also not limited at all. Metal, glass, resin or the like can be used. The film forming method of the present invention is an atmospheric pressure plasma method for forming a film under glow discharge at low temperature, so that a resin is preferably used particularly.

As the above-described resin, concretely, polyester film, polyethylene film, and polypropylene film, such as polyethylene terephthalate, polyethylene naphthalate or the like, cellulose esters, such as cellophane, cellulose diacetate film, cellulose acetate butyrate film, cellulose acetate propionate film, cellulose acetate phthalate film, cellulose triacetate, cellulose nitrate or the like, or a film made from their dielectrics, polyvinylidene chloride film, polyvinyl alcohol film, ethylene vinyl alcohol film, polyethylene system film, polycarbonate film, norbornene resin system film, polymethylpentene film, polyetherketone film, polyimide film, polyethersulfone film, polysulfone system film, polyetherketoneimide film, polyamide film, fluororesin film, nylon film, polymethyl methacrylate film, acryl film, polyarylate system film or the like can be given, These materials can be used solely or by being mixed appropriately.

Moreover, the one that these films are used as a support and a functional film, such as a protective layer, antistatic layer or the like, is applied on its surface can be also used as a substrate.

EXAMPLES

Hereinafter, the present invention will be explained concretely by examples. However, the present invention is not limited to these examples.

Example 1

A metal film was formed as follows by using the plasma treatment device 1 shown in FIG. 1. Here, the electrodes 3 and 4 have stainless steel SUS 316 as their base material, respectively. This base material is constructed so as to be capable of circulating heat-insulating water.

An alumina ceramic was sprayed over the whole surface of the base material of stainless steel in a thickness of 1 mm to cover around the base material except both side surfaces of the base material in a longitudinal direction. Thereafter, embrocation in which alkoxysilane monomer was dissolved in an organic solvent was applied to the above-described ceramic film and dried. Then, it was heat-treated at 150° C. to provide a dielectric. A high-frequency voltage was applied to the electrode 3 by the surface without the film, and the electrode 4 was connected to an earth. The distance between the electrodes 3 and 4 is 1 mm.

A film F as a substrate was passed between the electrodes 3 and 4 as shown in FIG. 1. Here, the film F is PET (polyethylene terephthalate). In this state, a gas type A was introduced between the electrodes. A high-frequency power source JRF-10000 (made by JEOL Ltd.) was used as the high-frequency power source 5, and a voltage having a frequency of 13.56 MHz and power of 10 W/cm$^2$ was applied.

A gas type B was made to flow together with the gas type A, and film forming on the film F was carried out for 15 seconds. The gas type B was supplied in a ratio (volume ratio) of 1/3 to the gas type A. Thereafter, the gas types A and B were replaced with a gas type C, and reducing is performed for 15 seconds. This operation was repeated four times, and a thin film (thickness of 1200 nm) of copper was obtained.

During the above-described plasma treatment, the intensity of the peak (777 nm) of the emission spectrum of oxygen was observed in real time to monitor the removal of oxygen by a probe for detecting spectrum of an emission spectrophotometer (made by Hamamatsu Photonics K.K.) provided in a position 5 cm apart from plasma space (between the electrodes 3 and 4) in the plasma treatment device. The intensity of the peak of oxygen was not detected at the time of the last reducing.

The gas types A, B and C have the following compositions.
Gas type A argon gas:hydrogen gas=99.1:0.9
Gas type B argon gas:hfa•Cu•tmvs=95:5
Supplied by mixing the hfa•Cu•tmvs to the argon gas in a carburetor made by STC Corp.
Gas type C argon gas:hydrogen gas=97:3

Here, the distance between the probe of the above-described emission spectrophotometer and plasma atmosphere is preferable to be 2 to 50 cm. The focal point of the probe is adjusted by a lens.

Example 2

A copper film was formed just as the same way as the Example 1 except further superimposing pulse voltage (10 kHz, on time/off time=0.5) to the high-frequency power source 5.

Comparative Example 1

By using copper as a target, a film was formed on a surface of the same substrate as in the Example 1 by an RF (Radio Frequency) sputtering method (vacuum state, frequency of 13.56 MHz) under atmosphere of argon gas and oxygen gas, and a thin film (thickness of 200 nm) of copper was obtained.

The film forming rates at the time of deposition of copper thin films, and the resistivities (corresponding to reciprocal number of the electric conductivities) of the obtained copper thin films in the Examples 1 and 2 and the Comparative example 1 are calculated and arranged in Table 1.

TABLE 1

|  | Example 1 | Example 2 | Comparative example 1 |
|---|---|---|---|
| FILM FORMING RATE (nm/sec.) | 10 | 12 | 0.7 |
| RESISTIVITY (×10$^{-8}$ Ωcm) | 3.46 | 6.05 | 6.29 |

As realized from Table 1, the film forming rate in case of vacuum sputtering method is "0.7". On the contrary, in the atmospheric pressure plasma method of the present invention, the film forming rate in the Example 1 is "10", and that in the Example 2 is "12", so that a copper oxide film can be formed at a rate of not less than ten times of the vacuum sputtering method.

Further, comparing the resistivities of the Example 1 and Example 2, the resistivity in the Example 2 is larger, that is, the electric conductivity is smaller. Thereby, it is proved that the impurities in the film can be made increase by superimposing a pulse.

Further, comparing the Example 1 and the Comparative example 1, the resistivity of the Comparative example 1 is larger, that is, it has more impurities, and it is in the same level as the Example 2 in which many impurities are included on purpose. Therefore, in case of forming more pure copper film, the method for reducing under atmospheric pressure plasma of the present invention can be used suitably.

Next, examples about the cases that various control conditions of electric field are combined to the above-mentioned reaction gas will be shown.

Example 3

A copper film was formed just the same way as in the Example 1 including the composition of the reactive gas, reducing gas and the like except the following electric conditions. A voltage having frequency of 200 kHz, and power of 1.2 W/cm$^2$ was applied between the electrodes 3 and 4 in FIG. 1.

Example 4

A copper film was formed just as the same way as in the above-described Example 1 except the following electric conditions. A voltage having frequency of 200 kHz, and power of 10 W/cm$^2$ was applied between the electrodes 3 and 4 in FIG. 1.

Example 5

A copper film was formed just as the same way as in the above-described Example 1 except the following electric conditions. A voltage having frequency of 13.56 MHz, and power of 1.2 W/cm$^2$ was applied between the electrodes 3 and 4 in FIG. 1.

Comparative Example 2

A copper film was formed just as the same way as in the above-described Example 1 except the following electric conditions. A voltage having frequency of 50 kHz, and power of 0.8 W/cm$^2$ was applied between the electrodes 3 and 4 in FIG. 1.

Comparative Example 3

A copper film was formed just as the same way as in the above-described Example 1 except the following electric conditions. A voltage having frequency of 50 kHz, and power of 10 W/cm$^2$ was applied between the electrodes 3 and 4 in FIG. 1.

Comparative Example 4

A copper film was formed just as the same way as in the above-described Example 1 except the following electric conditions. A voltage having frequency of 13.56 MHz, and power of 0.8 W/cm$^2$ was applied between the electrodes 3 and 4 in FIG. 1.

The film forming rates at the time of deposition of copper thin films and the resistivities of the obtained copper thin films in the above-described Examples 3 to 5 and the above-described Comparative examples 2 to 4 were calculated and arranged in Table 2 with the results of the above-described Example 1.

TABLE 2

| | FREQUENCY | POWER | FILM FORMING RATE (nm/sec.) | RESISTIVITY ($\Omega$cm) |
|---|---|---|---|---|
| Example 3 | 200 kHz | 1.2 W/cm$^2$ | 15 | $7.71 \times 10^{-7}$ |
| Example 4 | 200 kHz | 10 W/cm$^2$ | 13 | $5.03 \times 10^{-7}$ |
| Example 5 | 13.56 MHz | 1.2 W/cm$^2$ | 12 | $2.53 \times 10^{-7}$ |
| ExampLe 1 (from Table 1) | 13.56 MHz | 10 W/cm$^2$ | 10 | $3.46 \times 10^{-8}$ |
| Comparative example 2 | 50 kHz | 0.8 W/cm$^2$ | 18 | $8.17 \times 10^{-5}$ |
| Comparative example 3 | 50 kHz | 10 W/cm$^2$ | 16 | $5.83 \times 10^{-5}$ |
| Comparative example 4 | 13.56 MHz | 0.8 W/cm$^2$ | 15 | $2.72 \times 10^{-5}$ |

As realized from the results in Table 2, in the cases not in specific electric field conditions, the resistivity becomes in the order of 10$^{-5}$ $\Omega$cm, and the electric conductivity remained in a low level even though metal films were formed. On the contrary, in the cases that metal films were formed under specific electric conditions, it reaches the order of 10$^{-7}$ $\Omega$cm or 10$^{-8}$ $\Omega$cm, and the electric conductivity improved remarkably.

Accordingly, it is realized that a good film excellent in electric conductivity as a metal film is formed at a frequency over 100 kHz and power of not less than 1 W as electric conditions. This is presumed because a film becomes precise by specific electric conditions and this also affects the bonded state of a metal atom.

In the above, the examples of the present invention are explained. However, it is needless to say that the present invention is not limited to such examples, but various modifications are possible in a range within the scope of the present invention.

According to the film forming method utilizing the atmospheric pressure plasma method of the present invention, a pure and good metal film can be formed by supplying a reducing gas. Further, a precise and good metal film having further high electric conductivity can be obtained according to specific electric conditions.

Since it is atmospheric pressure plasma method, plasma density is higher and a film can be formed in a rate faster than the vacuum plasma method. Further, huge facilities, such as a vacuum device and the like, are not required, so that its cost is low.

In addition, when it is a step of repeating forming and reducing of oxide film, not only the surface but also in the thickness direction of the whole film can be reduced and a pure metal film can be obtained. Furthermore, the film becomes precise.

Moreover, impurities can be included on purpose by methods such as controlling pulse wave or the like, so that it can be applied widely. In addition, when plasma treatment is performed by monitoring emission spectrum, since the amount of impurities in plasma atmosphere can be grasped a pure film can be formed certainly. Moreover, a metal film including a predetermined amount of impurities can be formed on the contrary, so that film composition can be controlled freely.

The entire disclosure of Japanese Patent Application No. 2002-038933 filed on Feb. 15, 2002, and Japanese Patent Application No. 2002-170015 filed on Jun. 11, 2002 including specification, claims, drawings and summary are incorporated herein by reference in its entirety.

What is claimed is:

1. A metal film forming method comprising:
   (a) arranging a resin substrate between facing electrodes;
   (b) supplying a reactive gas comprising an organometallic compound between the electrodes, the organometallic compound being selected from a group consisting of a titanium compound, a copper compound, an indium compound, a zinc compound, a tin compound, an aluminum compound, and a silver compound;
   (c) making the reactive gas into a plasma state by applying a voltage between the electrodes at an electricity of 1-50 W/cm$^2$, a voltage frequency of 200 kHz-800 MHz, and a pressure of 20 to 100 KPa; and
   (d) forming a metal film on a surface of the resin substrate by supplying a reducing gas having a reducing property into the reactive gas in the plasma state, the reducing gas is one or more gases selected from the group consisting of hydrogen, ammonia, methane, ethane, hydrogen iodide, hydrogen sulfide, carbon monoxide, sulfur dioxide, hydrogen peroxide, and water.

2. The method of claim 1, wherein a metal oxide film derived from the reactive gas is formed on the surface of the resin substrate prior to supplying the reducing gas, and thereafter the metal film is formed by supplying the reducing gas to reduce the metal oxide film.

3. The method of claim 2, wherein the forming of the metal oxide film and the reducing of the metal oxide film by the reducing gas are repeated several times.

4. the method of claim 1, wherein the reactive gas and the reducing gas are supplied approximately contemporaneously.

5. The method of claim 1, wherein the reducing gas is supplied as a reductive mixed gas with an inert gas, and the reductive mixed gas includes 1 volume % to 10 volume % of the reducing gas.

6. The method of claim 1, wherein an electric conductivity of the metal film is controlled by including a predetermined concentration of an impurity.

7. The method of claim 6, wherein the impurity is one or more of the elements selected from the group consisting of H, C, N, O, F, S, Cl, Br and I.

8. The method of claim 6, wherein an amount of the impurity is adjusted by a power of the voltage applied between the electrodes or a concentration of the reducing gas.

9. The method of claim 1, wherein the plasma state is controlled by applying a pulse voltage between the facing electrodes, and adjusting its duty ratio.

10. The method of claim 1, wherein an amount of an impurity is monitored on a basis of an emission spectrum in the plasma atmosphere.

* * * * *

UNITED STATES PATENT AND TRADEMARK OFFICE
CERTIFICATE OF CORRECTION

| | | |
|---|---|---|
| PATENT NO. | : 7,632,550 B2 | Page 1 of 1 |
| APPLICATION NO. | : 10/364551 | |
| DATED | : December 15, 2009 | |
| INVENTOR(S) | : Mizuno et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 555 days.

Signed and Sealed this

Second Day of November, 2010

David J. Kappos
*Director of the United States Patent and Trademark Office*